United States Patent [19]
Takeuchi

[11] Patent Number: 5,942,964
[45] Date of Patent: Aug. 24, 1999

[54] NOISE ABSORBING APPARATUS

[75] Inventor: Yasuichi Takeuchi, Tokyo, Japan

[73] Assignee: Takeuchi Industrial Co., Ltd., Tokyo, Japan

[21] Appl. No.: 08/885,362

[22] Filed: Jun. 30, 1997

[30] Foreign Application Priority Data

Jul. 19, 1996 [JP] Japan ..................................... 8-191070

[51] Int. Cl.⁶ ............................. H01F 17/06; H01F 27/02; H01F 27/26
[52] U.S. Cl. ............................... 336/92; 174/92; 336/175; 336/176
[58] Field of Search .............................. 336/92, 175, 176, 336/174, 212; 174/65 G, 65 SS, 92; 333/81 R, 182, 183, 12; 324/127

[56] References Cited

U.S. PATENT DOCUMENTS 4,150,250  4/1979  Lundeberg ........................ 134/65 SS
5,355,109  10/1994  Yamazaki ................................ 336/175

FOREIGN PATENT DOCUMENTS

| 41 04 100 A1 | 2/1991 | Germany . |
| 92 14 721 U | 12/1992 | Germany . |
| 63-39997 | 3/1988 | Japan . |
| 403-268379 | 11/1991 | Japan . |

Primary Examiner—Thomas J. Kozma

[57] ABSTRACT

A noise absorbing apparatus includes a pair of ferrite members and a pair of covers. The ferrite members are located to oppose each other in tight contact with each other to clamp a cable therebetween. The covers cover the ferrite members. The covers form opening portions through which the cable is inserted. The covers are integrally formed with cable clamping pieces partly projecting in a radially inward direction of the opening portions. Each of the cable clamping pieces has a direction of thickness which is aligned with the radial direction of the cable. The cable is clamped with an elastic deformation force of the cable clamping pieces in the direction of thickness.

2 Claims, 6 Drawing Sheets

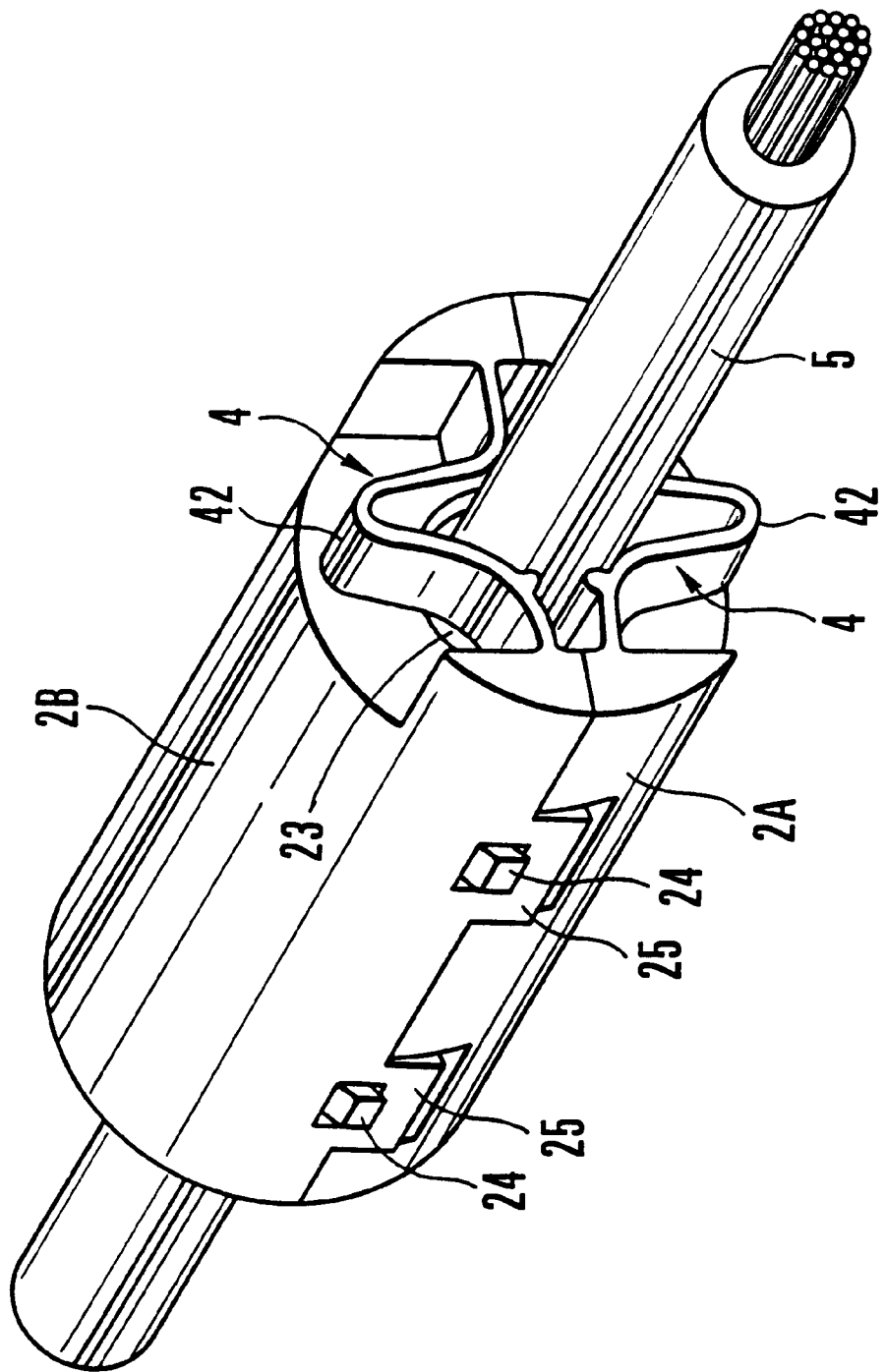
F I G. 5

NOISE ABSORBING APPARATUS

BACKGROUND OF THE INVENTION

The present invention relates to a noise absorbing apparatus used for absorbing noise superposed on a signal transmitted through a cable and, more particularly, to an apparatus in which a closed magnetic circuit is formed to absorb noise with ferrite members so as to enclose a cable.

In an electronic equipment, e.g., a computer, that processes digital signals, when noise is superposed on a signal transmitted through a cable and enters the equipment, it causes malfunction of the equipment. For this reason, various types of noise absorbing apparatuses have recently been proposed. For example, a pair of ferrite members divided in the radial direction are arranged to sandwich a cable between them, and a closed magnetic circuit that encloses the cable is constituted with these ferrite members, thereby absorbing noise superposed on the cable. The noise is prevented from entering the equipment.

In order to improve the noise absorbing effect of a noise absorbing apparatus of this type, the apparatus is preferably fixed at a predetermined position in the longitudinal direction of the cable. More specifically, when a noise absorbing apparatus of this type is to be put into practical use, the position of the apparatus with respect to the cable where the noise absorbing effect is most conspicuous must be obtained through experiments or the like, and the noise absorbing apparatus must then be fixed at the obtained position on the cable. For this purpose, conventionally, an arrangement for fixing the noise absorbing apparatus with respect to the cable is provided.

For example, in Japanese Utility Model Laid-Open No. 63-39997, projections are formed on the inner edges of cable insertion openings respectively formed in covers that support a pair of ferrite members. When the covers are closed and the ferrite members are coupled to each other, the projections come into contact with or bite into the outer coating of the cable to fix it. With this arrangement, however, since the projections are formed fixedly, if the diameter of the cable is small, the projections do not sometimes come into contact with or bite into the outer coating of the cable. If the cable has a large diameter and the outer coating is highly rigid, the covers cannot sometimes be closed.

In order to cope with these problems, Japanese Patent Laid-Open No. 3-268397 discloses a technique in which cable press pieces having end portions projecting toward the opening portions of the covers are provided. The end portions of the cable press pieces press the outer coating of the cable to clamp the cable, thereby fixing and supporting the cable. With this technique, the end portions of the cable press pieces flex in the radial direction, so that the noise absorbing apparatus can be fixed even for cables having different diameters.

According to the technique disclosed in this reference, however, the cable press pieces have a cantilevered structure in which their proximal end portions are fixed to the covers and their end portions that are brought into contact with the cable project toward the opening portions. In addition, the directions of thickness of the cable press pieces are aligned with the same direction as the inserting direction of the cable. For this reason, when they clamp the cable and are flexed in the radial direction, the cable press pieces are elastically deformed in a direction parallel to their surfaces, i.e., in a direction perpendicular to the direction of thickness. The degree of elastic deformation of the cable press pieces is thus limited, and these cable press piece are difficult to cope with various types of cables having large diameter differences. In this case, for example, if the width of the cable press pieces is decreased in order to increase the degree of elastic deformation, the clamping force is decreased to decrease the fixing support force of the noise absorbing apparatus. As a result, it is difficult to fix and support various types of cables having different diameters with a sufficiently large clamping force.

SUMMARY OF THE INVENTION

It is an object of the present invention to provide a noise absorbing apparatus that can obtain a sufficiently large clamping force even for various types of cables having different diameters so that the fixing support force for the cables can be increased.

In order to achieve the above object, according to the present invention, there is provided a noise absorbing apparatus comprising a pair of ferrite members located to oppose each other in tight contact with each other to clamp a cable therebetween, and a pair of covers covering the ferrite members, the covers forming opening portions through which the cable is inserted, wherein the covers are integrally formed with cable clamping pieces partly projecting in a radially inward direction of the opening portions, each of the cable clamping pieces having a direction of thickness which is aligned with a radial direction of the cable, and the cable is clamped with an elastic deformation force of the cable clamping pieces in the direction of thickness.

BRIEF DESCRIPTION OF THE DRAWINGS

FIG. 5 is a perspective view showing a state wherein the cable clamping pieces are fixed on a cable.

DESCRIPTION OF THE PREFERRED EMBODIMENT

Figure 1:
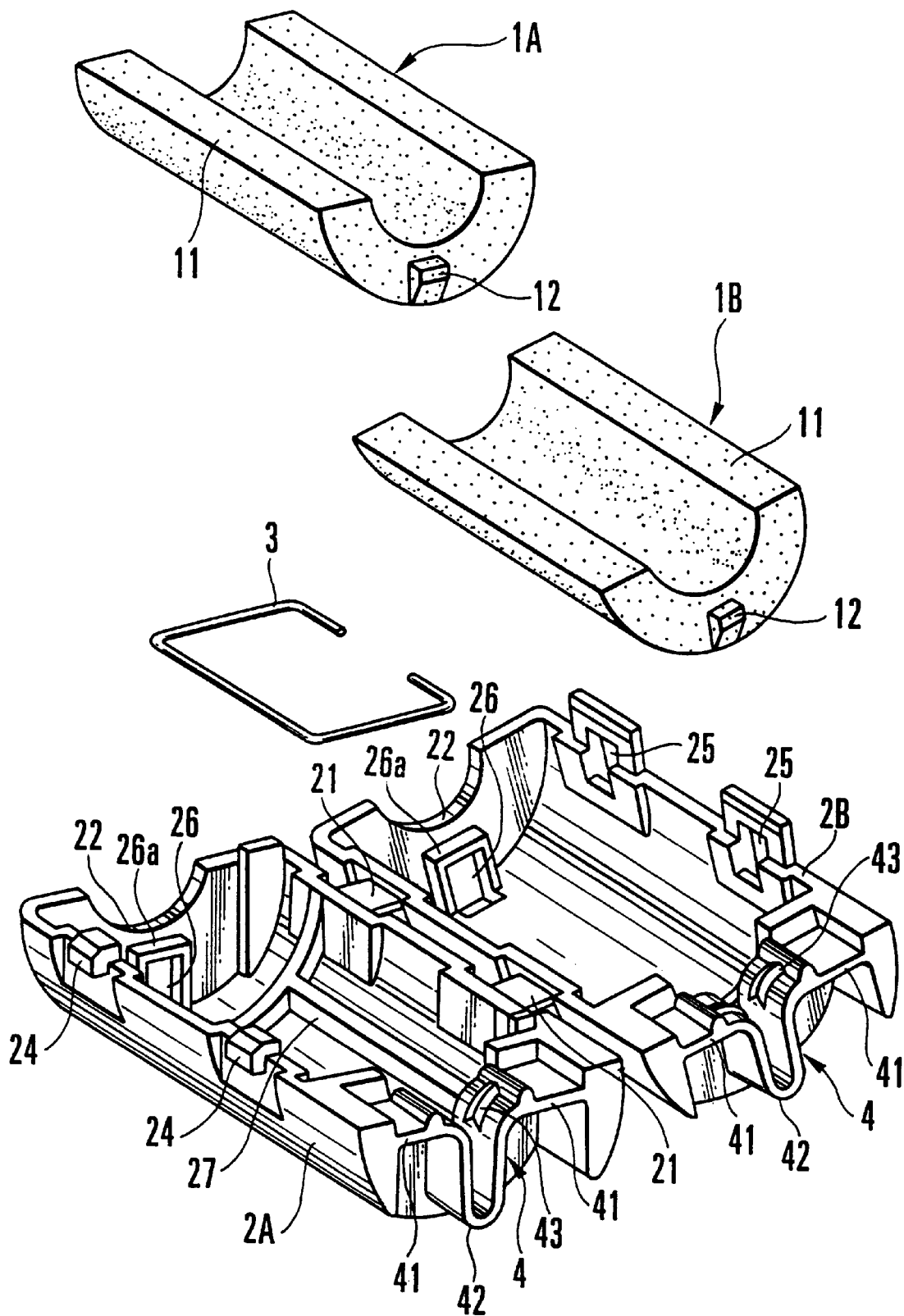
FIG. 1 is a partially exploded perspective view of an embodiment of the present invention.
Figure 2:
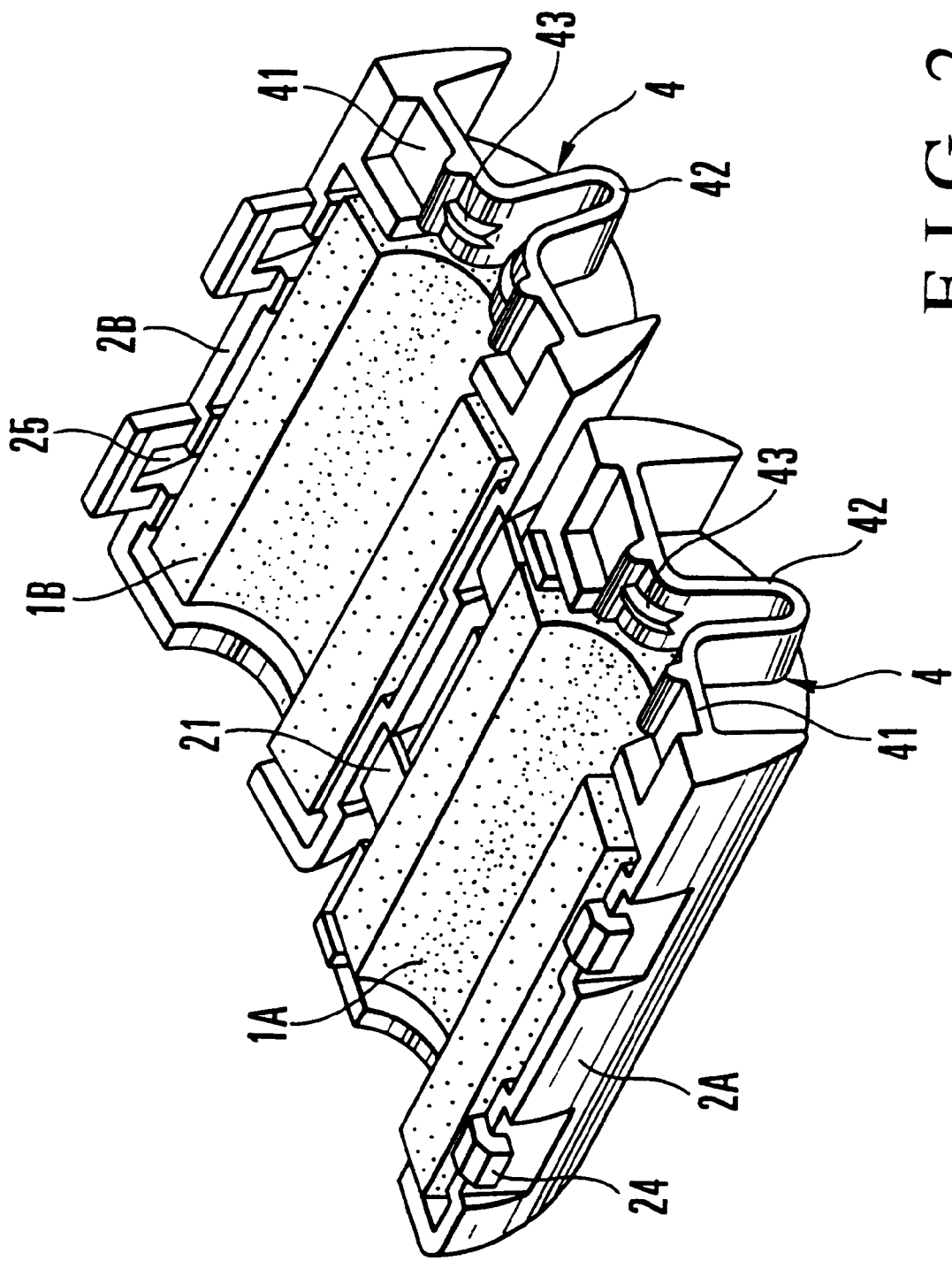
FIG. 2 is a perspective view showing the embodiment of FIG. 1 in an assembled state.
Figure 3A:
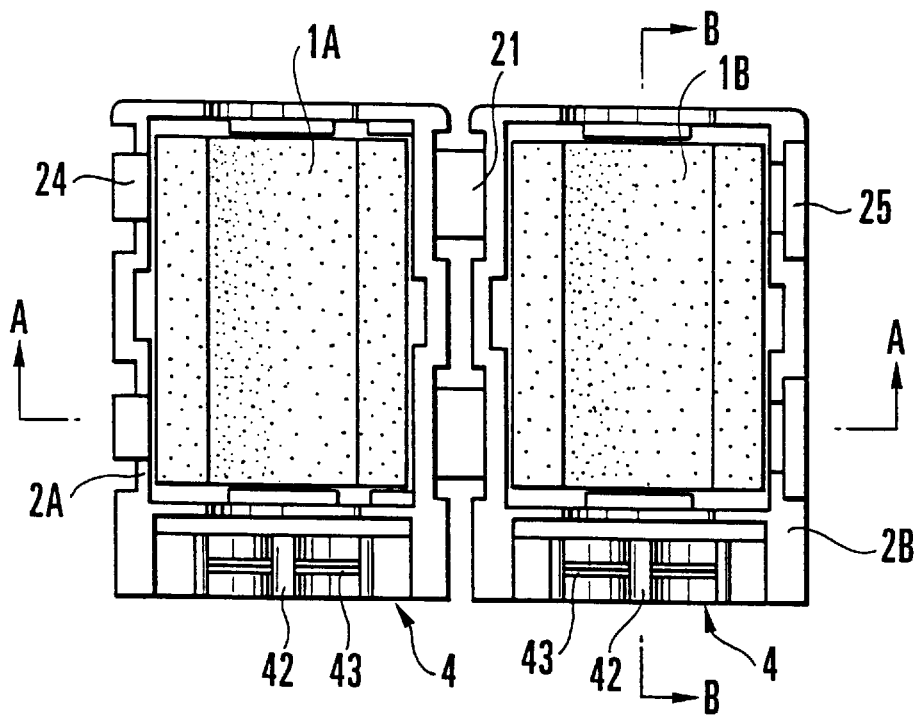
FIG. 3A is a plan view of FIG. 2.
Figure 3B:
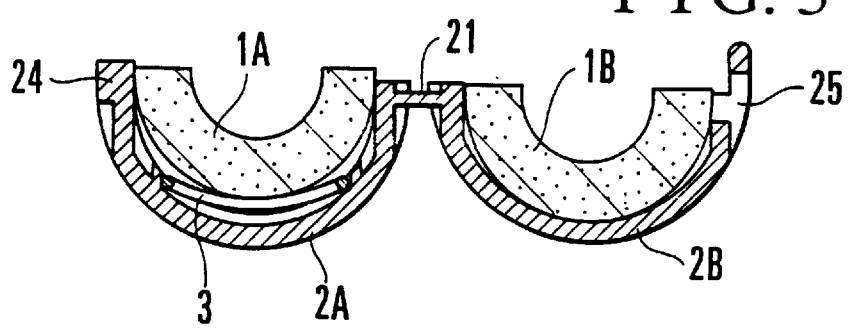
FIG. 3B is a sectional view taken along the line A—A of FIG. 3A.
Figure 3C:
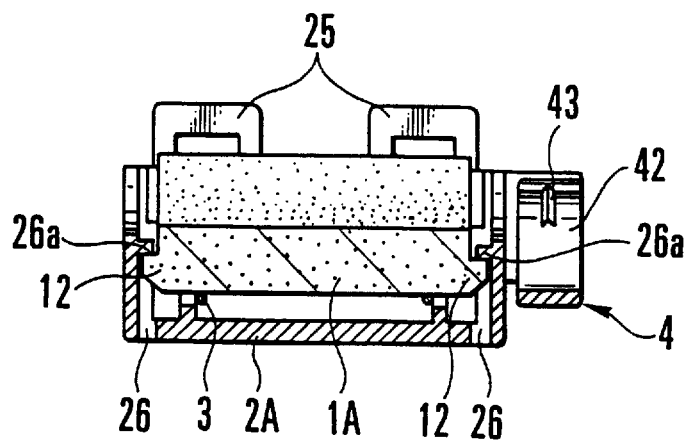
FIG. 3C is a sectional view taken along the line B—B of FIG. 3A.

A preferred embodiment of the present invention will be described with reference to the accompanying drawings. FIG. 1 shows this embodiment, and FIG. 2 and FIGS. 3A to 3C show this embodiment in an assembled state. Referring to these drawings, reference numerals 1A and 1B denote a pair of semicylindrical ferrite members; and 2A and 2B, covers forming substantially semicylindrical containers for mounting and supporting the ferrite members 1A and 1B therein, respectively, and fixing and supporting them on a cable that absorbs noise. When the ferrite members 1A and 1B are brought into contact with each other to clamp a noise absorbing cable between their inner circumferential surfaces such that their flat surfaces 11 located along their diameters oppose each other, they form a closed magnetic circuit enclosing the cable, thereby absorbing noise superposed on a signal transmitted through the cable. This noise absorbing operation is already known widely and a description thereof will thus be omitted. Support projections 12 are formed on the two end faces in the axial direction of each of the ferrite members 1A and 1B at positions along the outer circumferential surface to project in the axial direction, so that the ferrite members 1A and 1B are mounted in and supported by the covers 2A and 2B, respectively. The outer circumferential surface sides of the support projections 12 are tapered so that the ferrite members 1A and 1B can be mounted and supported in the covers 2A and 2B easily, as will be described later.

The covers 2A and 2B are made of a resin while they are integrally connected to each other through a pair of connecting pieces 21 at one side portion of each cover. The covers 2A and 2B can be opened and closed in the radial direction due to the flexibility of the connecting pieces 21. When they are closed, the covers 2A and 2B constitute a cylindrical container. Semicircular inner edge portions 22 of the covers 2A and 2B form opening portions 23 (see FIGS. 5 and FIGS. 6A and 6B) on the two end faces of the cylindrical container. A pair of arrowhead-shaped engaging projecting portions 24 project from the other side portion of one cover 2A, among the covers 2A and 2B, in the tangential direction of the cylindrical surface of the cover 2A. A pair of engaging holes 25 are formed in the other side portion of the other cover 2B to engage with the corresponding engaging projecting portions 24 that are inserted therein.

A peripheral region of the inner surface of each of the two ends in the axial direction of each of the covers 2A and 2B, which extends from the outer circumferential side toward the inner circumferential side, is formed partly thick. A support groove 26 is formed in each thick walled portion to extend from the outer side toward the center. The support groove 26 forms a stepped portion 26a in the radial direction. The support projections 12 formed on the two end faces of each of the ferrite members 1A and 1B can fit with the corresponding stepped portions 26a. A rectangular rib-shaped spring frame 27 is formed on the inner surface of one cover 2A, of the two covers 2A and 2B, along the circumferential edge of the cover 2A. A rectangular bent wire spring 3 can be mounted in this spring frame 27, as shown in FIG. 1.

Figure 4A:
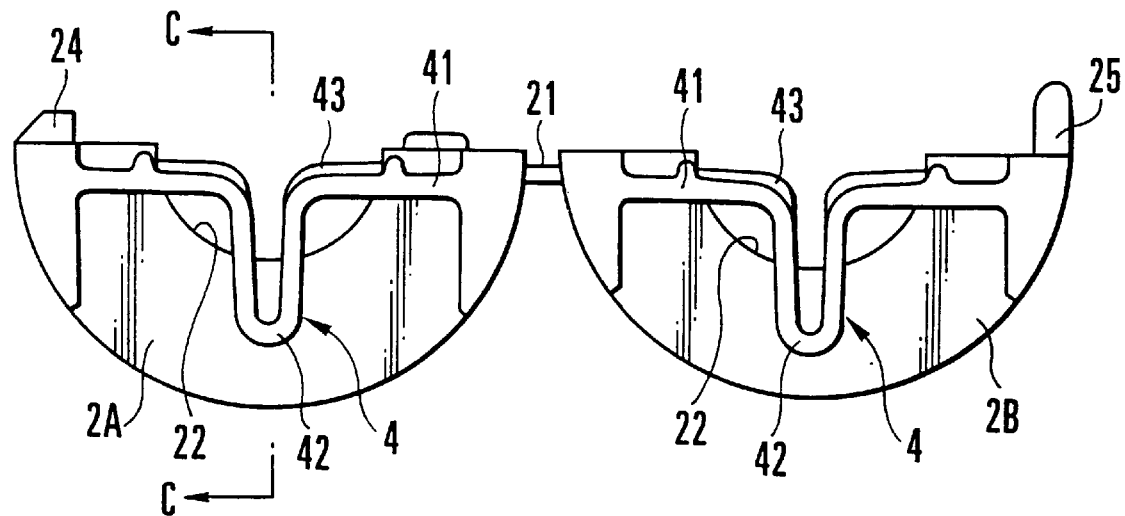
FIG. 4A is a side view for explaining cable clamping pieces.
Figure 4B:
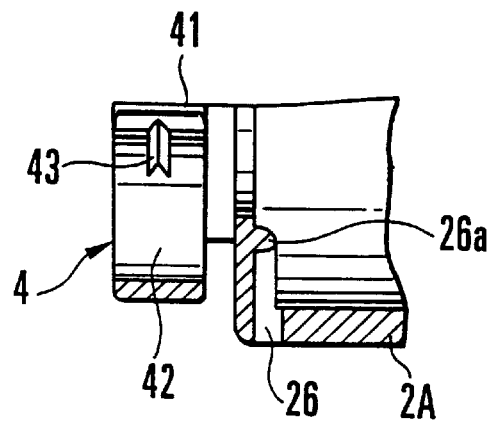
FIG. 4B is a sectional view taken along the line C—C of FIG. 4A.

As shown in the side view of FIG. 4A and the sectional view of FIG. 4B taken along the line C—C of FIG. 4A, a cable clamping piece 4 is fixed and supported on one end face in the axial direction of each of the covers 2A and 2B at their end portions 41 in the radial direction. An intermediate portion 42 of the cable clamping piece 4 is formed at a position spaced apart by a small gap from one end face of the corresponding cover 2A or 2B where the clamping piece 4 is arranged. This intermediate portion 42 is a U shaped portion opening in the same direction as that of the opening portion 23 and having a bottom portion projecting outward in the radial direction. The opening edge portions of the U-shaped portions 42 project to be located in the corresponding opening portion 23 formed by the two covers 2A and 2B. The opposing gap between the U-shaped portions 42 is sufficiently smaller than the diameter of the cable to be used. At least the axial length, i.e., the width, and the thickness of the intermediate portion 42 are set such that an appropriate clamping force can be obtained, as will be described later. Ribs 43 each having a tapered protruding section are integrally formed on the surface of each intermediate portion 42.

In the noise absorbing apparatus having this arrangement, the ferrite members 1A and 1B are mounted in the covers 2A and 2B, respectively. Regarding this mounting, the ferrite members 1A and 1B need only be pushed into the covers 2A and 2B such that their cylindrical surfaces are pointed to them. Then, the support projections 12 formed on the ferrite members 1A and 1B ride over the stepped portions 26a of the support grooves 26 because of their taper shape, and engage with the stepped portions 26a. Because of engagement between the support projections 12 and the stepped portions 26a at the two end portions in the axial direction of the ferrite members 1A and 1B, the ferrite members 1A and 1B are prevented from coming out from the covers 2A and 2B. When supporting the ferrite members 1A and 1B, on the side of one cover 2A, before the ferrite member 1A is pushed into the cover 2A, the wire spring 3 is placed in the cover 2A. The wire spring 3 is placed in the spring frame 27 and the position of the spring 3 is regulated at its two sides by the spring frame 27. In this state, since the wire spring 3 is flat, its intermediate side portions float from the inner surface of the cover 2A forming a cylindrical surface. When the ferrite member 1A is pushed into the cover 2A from above through wire spring 3 to be supported in the cover 2A, the wire spring 3 is flexed in the radially outward direction by the ferrite member 1A, and inversely the ferrite member 1A is biased toward the flat surfaces 11 due to the elastic force obtained as the reaction force of the flexing force of the wire spring 3.

Therefore, as shown in FIG. 5, while a cable 5 is inserted in the inner circumferential surfaces of the ferrite members 1A and 1B across the opening portions 23 of the covers 2A and 2B, when the connecting pieces 21 between the covers 2A and 2B are bent to join the covers 2A and 2B together, the covers 2A and 2B are integrally connected to oppose each other through engagement between the engaging projecting portions 24 and the engaging holes 25, and the cylindrical container described above is constituted. The cable 5 extends through the opening portions 23. In this state, the ferrite member 1A in one cover 2A is biased toward the other ferrite member 1B with the biasing force of the wire spring 3, so that the flat surfaces 11 of the two ferrite members 1A and 1B come into tight contact with each other. Thus, a closed magnetic circuit enclosing the cable 5 is constituted by the ferrite members 1A and 1B to absorb noise on the cable 5.

Figure 6A:
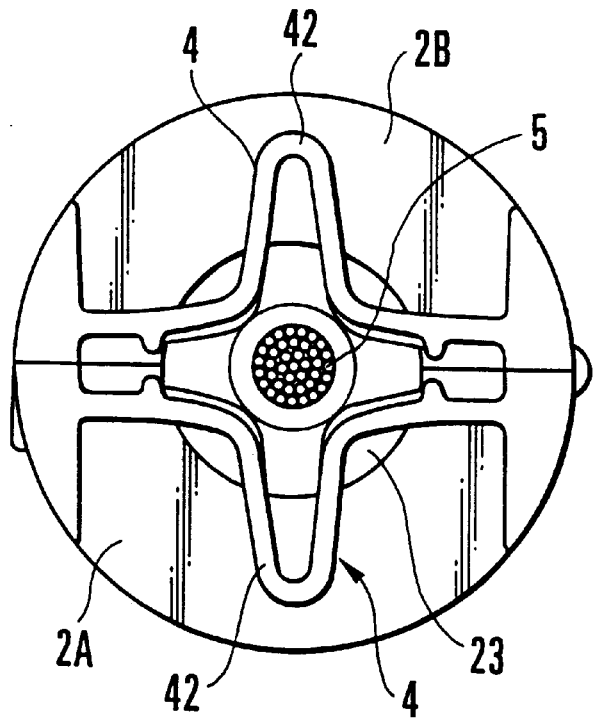
FIGS. 6A and 6B are side views for explaining the operation of the cable clamping pieces.
Figure 6B:
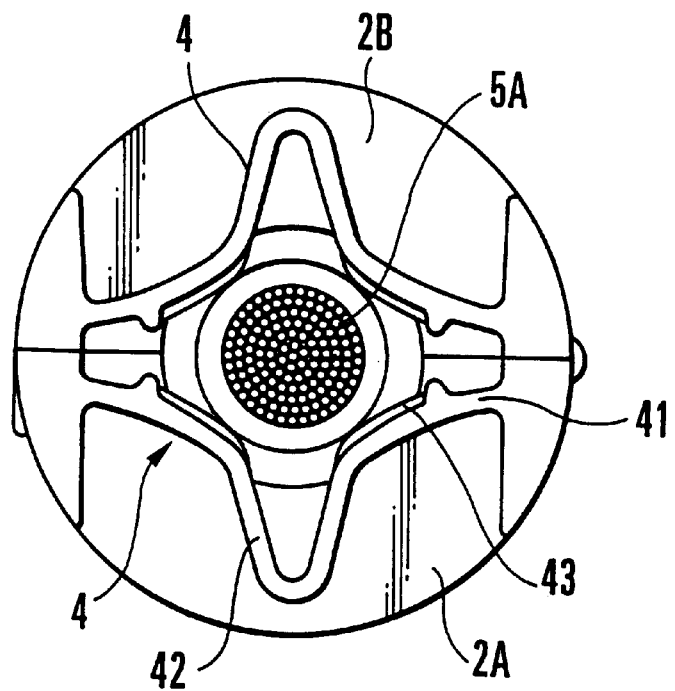

The U-shaped portions 42 of the cable clamping pieces 4 of the covers 2A and 2B are brought into contact with the outer surface of the inserted cable 5 because the U-shaped portions 42 are located within the diameter range of the corresponding opening portion 23, as shown in FIG. 6A. For this reason, the cable clamping pieces 4 are elastically deformed outward in the radial direction as a whole, and their U-shaped portions 42 are elastically deformed such that their opposing widths are increased to correspond to the diameter of the cable 5 because the opening portions of the U-shaped portions 42 are brought into contact with the outer surface of the cable 5. For this reason, the U-shaped portions 42 are fixed to the cable 5 to allow the noise absorbing apparatus to fix to the cable 5. Therefore, if a large-diameter cable 5A is employed, as shown in FIG. 6B, the degree of elastic deformation of the U-shaped portions 42 is large, so that the U-shaped portions 42 clamp the cable 5A with their opposing gap widely open. As a result, the noise absorbing apparatus can be fixed regardless of the diameter of the cable.

Since the U-shaped portions 42 of the cable clamping pieces 4 are separate from the corresponding end faces of the covers 2A and 2B, they are deformable independently of the covers 2A and 2B. Since the elastic deformation of the cable clamping pieces 4 in the directions of diameter and opposing gap occurs in the direction of thickness of the cable clamping pieces 4, the elastic deformation of the cable clamping pieces 4 is facilitated regardless of the width of the cable clamping pieces 4. In this case, if the thickness of the cable clamping pieces 4 is increased, a large clamping force can be obtained. Hence, the range of elastic deformation of the cable clamping pieces 4 can be widened, so that the noise absorbing apparatus can be reliably fixed on various types of cables ranging from those having a small diameter to those having a large diameter while a large clamping force can be obtained with the cable clamping pieces 4. The reliability to fix the noise absorbing apparatus on the cable is thus increased.

Since the ribs 43 formed on the surfaces of the U-shaped portions 42 of the cable clamping pieces 4 bite into the outer coating of the cable 5, the fixing force with which the noise absorbing apparatus is fixed on the cable 5 can be further increased. In this embodiment, since the cable clamping pieces 4 are located on the outer side in the axial direction of the end portions of the covers 2A and 2B, the ferrite members 1A and 1B can be mounted in the covers 2A and 2B over the entire length of the covers 2A and 2B in the axial direction. When compared to the arrangement in which cable press pieces are arranged in the covers, as in Japanese Patent Laid-Open No. 3-267395 described above, ferrite members having a large axial length with respect to the outer size of covers can be used, thereby improving the noise absorbing effect accordingly. A compact noise absorbing apparatus having a high noise absorbing effect can therefore be obtained.

In this embodiment, the ferrite members 1A and 1B are formed with the support projections 12, and the covers 2A and 2B are formed with the support grooves 26 and their stepped portions 26a. Therefore, as compared to ferrite members formed with recessed support portions, the ferrite members of this embodiment are molded easier, and the size precision of the molded ferrite members is improved, thereby improving positional precision in mounting on the covers. Accordingly, since the covers only need be formed with support grooves, when integrally molding the covers, the support grooves and stepped portions can be molded easily with a cutting mold. As the spring 3 used for bringing the ferrite members 1A and 1B into tight contact with each other, one obtained by bending a wire spring is used. When compared to a spring obtained by bending a leaf spring, a reduction in cost and weight of the spring can be further expected. The length and bending shape of the wire spring can be arbitrarily designed, and the spring force of the wire spring, i.e., the abutting force of the ferrite member can be arbitrarily changed and adjusted. This adjustment can be performed very easily when compared to adjustment of a leaf spring.

In the present invention, the U-shaped portion as the intermediate portion of the cable clamping piece may be changed to a V-shaped portion or an arc portion, e.g., a semicircular portion. It suffices as far as the clamping piece is deformable in the radial direction and has a pair of opposing wall portions. The boundary portions between the intermediate portion and the two end portions of the cable clamping piece form curved surfaces, as in this embodiment. This is desirable because, when clamping a cable having another diameter, the cable clamping piece is elastically deformed in accordance with the cable diameter. Furthermore, if the thickness of the cable clamping piece is changed among its two end portions and central portion, or is continuously changed among them, a more desirable cable clamping force can be obtained.

As has been described above, according to the present invention, the covers in which the ferrite members are mounted and supported are integrally formed with the cable clamping pieces partly projecting inward in the radial direction of the opening portions. The direction of thickness of these cable clamping pieces is aligned with the radial direction of the cable, and the cable clamping pieces clamp the cable with their elastic formation force in the direction of thickness. Thus, as the cable clamping piece, one having a large elastic deformation amount can be obtained. The noise absorbing apparatus can be fixed on a cable having another diameter. When the thickness and width of the cable clamping pieces are appropriately set, a clamping force generated by a large elastic deformation force can be obtained. The noise absorbing apparatus can thus be fixed with a high reliability. Since the cable clamping pieces are arranged outside the covers, the size of the ferrite members in the axial direction can be increased. As a result, a compact noise absorbing apparatus having a large noise absorbing effect can be obtained.

What is claimed is:

1. A noise absorbing apparatus comprising:
a pair of ferrite members (1A, 1B) located to oppose each other in tight contact with each other to clamp a cable (5) therebetween; and a pair of covers (2A, 2B) covering said ferrite members, said cover forming opening portions (23) through which the cable is inserted, said cover being integrally formed with respective cable clamping pieces (4) partly projecting in a radially inward direction of said opening portions, said clamping pieces respectively comprising a pair of opposing wall portions which are deformable in a radial direction of said cable, such that said cable is clamped with an elastic deformation force of said cable clamping pieces, each of said cable clamping pieces projecting in a coaxial direction from one axial end face of a corresponding one of said covers, and each of said cable clamping pieces being fixed on said covers at two positions (41) thereof, and having intermediate portions (42) projecting inwardly in a radial direction into said opening portions, said intermediate portions (42) being formed at a position spaced apart by a gap from the end face of the respective cover.

2. An apparatus according to claim 1, wherein each of said intermediate portions forms a U-shaped portion which is open inward in the radial direction of the cable and has a bottom portion projecting outward in the radial direction.

* * * * *